United States Patent
Chen et al.

(10) Patent No.: US 9,424,927 B2
(45) Date of Patent: Aug. 23, 2016

(54) MEMORY SYSTEM, CONTROL SYSTEM AND METHOD OF PREDICTING LIFETIME

(71) Applicant: Kabushiki Kaisha Toshiba, Tokyo (JP)

(72) Inventors: Jiezhi Chen, Yokohama (JP);
Tetsufumi Tanamoto, Kawasaki (JP);
Yuichiro Mitani, Kanagawa (JP);
Takao Marukame, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 32 days.

(21) Appl. No.: 14/187,668

(22) Filed: Feb. 24, 2014

(65) Prior Publication Data
US 2014/0293692 A1    Oct. 2, 2014

(30) Foreign Application Priority Data
Apr. 1, 2013   (JP) ................. 2013-075598

(51) Int. Cl.
| | |
|---|---|
| G11C 16/00 | (2006.01) |
| G11C 16/06 | (2006.01) |
| G11C 11/56 | (2006.01) |
| G11C 16/04 | (2006.01) |
| G11C 16/34 | (2006.01) |

(52) U.S. Cl.
CPC ............ *G11C 16/06* (2013.01); *G11C 11/5628* (2013.01); *G11C 16/0483* (2013.01); *G11C 16/3495* (2013.01)

(58) Field of Classification Search
None
See application file for complete search history.

(56) References Cited

U.S. PATENT DOCUMENTS

| | | | |
|---|---|---|---|
| 6,873,932 B1* | 3/2005 | Kim | ............... G01R 31/287 702/182 |
| 2006/0158210 A1* | 7/2006 | Tsai | ............... G01R 31/2642 324/762.09 |

FOREIGN PATENT DOCUMENTS

| | | |
|---|---|---|
| JP | 9-153600 | 6/1997 |
| JP | 2004-23044 | 1/2004 |
| JP | 2009-238279 | 10/2009 |

\* cited by examiner

*Primary Examiner* — Kretelia Graham
(74) *Attorney, Agent, or Firm* — Finnegan, Henderson, Farabow, Garrett & Dunner LLP

(57) ABSTRACT

A memory system according to an embodiment may have an integration unit and a prediction unit. The integration unit may detect substrate current flowing through a substrate of a non-volatile memory when the non-volatile memory with a memory cell which has binary or multivalued being the binary or more is written/erased. The integration unit may records an integration value of the detected substrate current into a storage. The prediction unit may predict a lifetime of the non-volatile memory based on the integration value which is recorded on the storage.

8 Claims, 11 Drawing Sheets

MEMORY SYSTEM, CONTROL SYSTEM AND METHOD OF PREDICTING LIFETIME

CROSS-REFERENCE TO RELATED APPLICATION(S)

This application is based upon and claims the benefit of priority from the Japanese Patent Application No. 2013-075598, filed on Apr. 1, 2013; the entire contents of which are incorporated herein by reference.

FIELD

Embodiments described herein relate generally to a memory system, a control system and a method of predicting lifetime.

BACKGROUND

Conventionally, as a lightweight and high-speed memory system capable of power-saving, there is a flash memory drive (SSD: solid state drive) equipped with integrated NAND flash memories. As an operation mode of such SSD, a SLC (single level cell) type or MLC (multiple level cell) type access reliability model has been used. However, a reliability model for switching operation between a SLC access mode (hereinafter to be referred to as a SLC mode) and a MLC access mode (hereinafter to be referred to as a MLC mode) is not still established. In order to provide a uniform reliability model and install the model on a SSD system, a circuit design capable of predicting lifetime of NAND chips in a SSD is necessary.

DETAILED DESCRIPTION

Exemplary embodiments or an image processing device, a memory system, a control system and a method of predicting lifetime will be explained below in detail with reference to the accompanying drawings.

In the following embodiment, a life monitor system (LMS) is installed on a SSD system. By installing the LMS, it becomes possible to predict a remaining lifetime of write/erasure cycles in each operation mode of a SLC mode and a MLC mode (first mode and second mode (random order)), and a combination operation mode of the SLC mode and the MLC mode.

As the LMS, it is possible to use an anode hole injection (AHI) model, for instance. In the AHI model, by integrating substrate currents associated with each write/erasure operation in different operation modes, a total amount of hole-injection (Qh value) (hereinafter amount of hole-injection will be referred to as hole-injected amount) is calculated. The calculated Qh value is managed by stored in a non-volatile memory, or the like, and is used for predicting the remaining lifetime depending on an operation mode of each block.

In the following embodiment, when writing/erasing in the SLC mode, the MLC mode or the combination operation mode of the SLC mode and the MLC mode, an amount of holes injected in a tunnel layer by a single write/erasure ($Qh_{WE}$ value) is monitored. Furthermore, by comparing the total hole-injected amount (Qh value) and a critical hole-injected amount in each mode ($Qh_{bd}$ value), the remaining lifetime in each operation mode (the number of W/E cycling) is predicted. Here, the critical hole-injected amount ($Qh_{bd}$ value) is a total value of hole-injected amounts until an NAND flash cell can not be written/erased. The critical hole-injected amount ($Qh_{bd}$ value) may be previously decided based on simulation, experiment, or the like.

Next, a memory system according to the embodiment will be described in detail with reference to the accompanying drawings. In the following explanation, as the memory system, a SSD system will be used. In the SSD system, NAND chips being storage areas are divided into a plurality of blocks. In the following embodiment, by integrating substrate currents of each block individually, the lifetime (the number of writable/erasable cycling) of each block in the different modes will be predicted.

Figure 1:
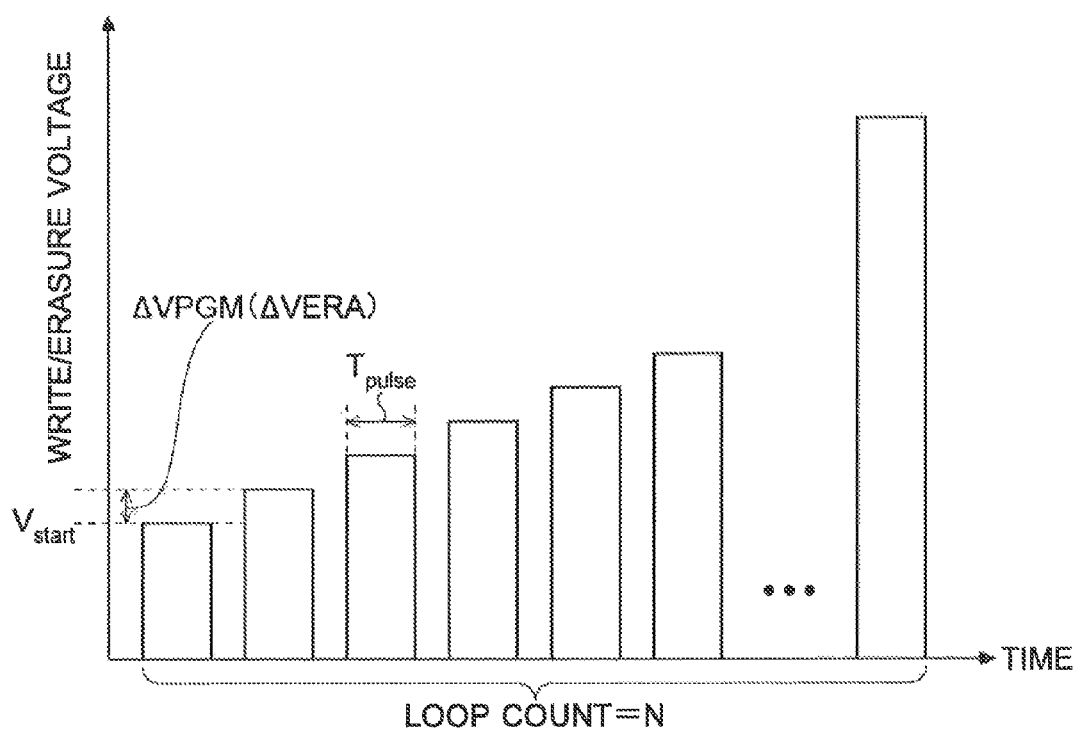
FIG. 1 is an operation sequence showing an example of write/erasure operation to a non-volatile memory according to an embodiment.

For a lifetime prediction mechanism of the NAND flash cells installed on the NAND chip will be described with reference to the accompanying drawings. FIG. 1 is an operation sequence showing an example of write/erasure operation to a non-volatile memory. In FIG. 1, an operation of writing/erasing data in/from an NAND flash cell includes an operation sequence in which a pulse stress being a combination of a constant starting voltage ($V_{start}$) and a step voltage (ΔVPGM or ΔVERA) is impressed multi times. ΔVPGM is a step voltage for writing and ΔVERA is a step voltage for erasing. Between each of pulses, verification (readout) for verifying a condition of written is executed.

Compared with the NAND flash generation, the embodiment is different in that the starting voltage Vstart, the step voltage ΔVPGM or ΔVERA, a pulse time (Tpulse) and a pulse count (loop count=N) are used. Even with the same generation, there is a case where operation sequence parameters in different modes (SLC mode, MLC mode, TLC mode, for instance) are different depending on products.

Figure 2:
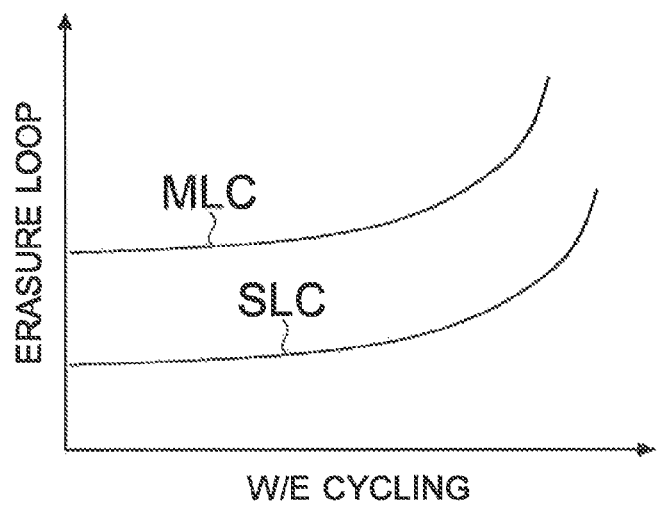
FIG. 2 is a graph showing a relationship between the number of cycling of write/erasure operations to an NAND flash cell and a loop count of pulses occurred at a time of erasure operations.

FIG. 2 is a graph showing a relationship between the number of cycling (hereinafter to be referred to as cycling count) of write/erasure operation (W/E cycling) to an NAND flash cell and a loop count of pulses (erasure loops) occurred at a time of erasure operations. FIG. 2 is a graph showing a relationship between a cycling count of write/erasure operation (W/E cycling) to the NAND flash cell and a loop count, of pulses (program loop) occurred at a time of write operations.

Figure 3:
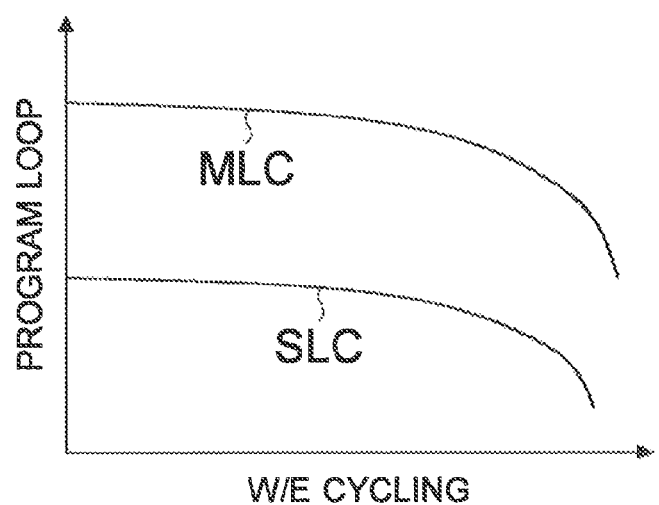
FIG. 3 is a graph showing a relationship between the number of cycling of write/erasure operations to an NAND flash cell and a loop count of pulses occurred at a time of write operations.

By repeating write/erasure operations with respect to the NAND flash cell, a loop count of pulses (erasure loops) necessary for the erasure operation of the NAND flash cell increases as shown in FIG. 2, whereas a loop count of pulses (program loops) necessary for the write operation of the NAND flash cell decreases as shown in FIG. 3. This indicates that as a result of electron defects occurring in the tunnel layer of the NAND flash cell depending on the cycling count of write/erasure operations (W/E cycling), writing in the NAND flash cell becomes easy while erasing from the NAND flash cell becomes difficult. This is similar in both of the SLC mode and the MLC mode.

Figure 4:
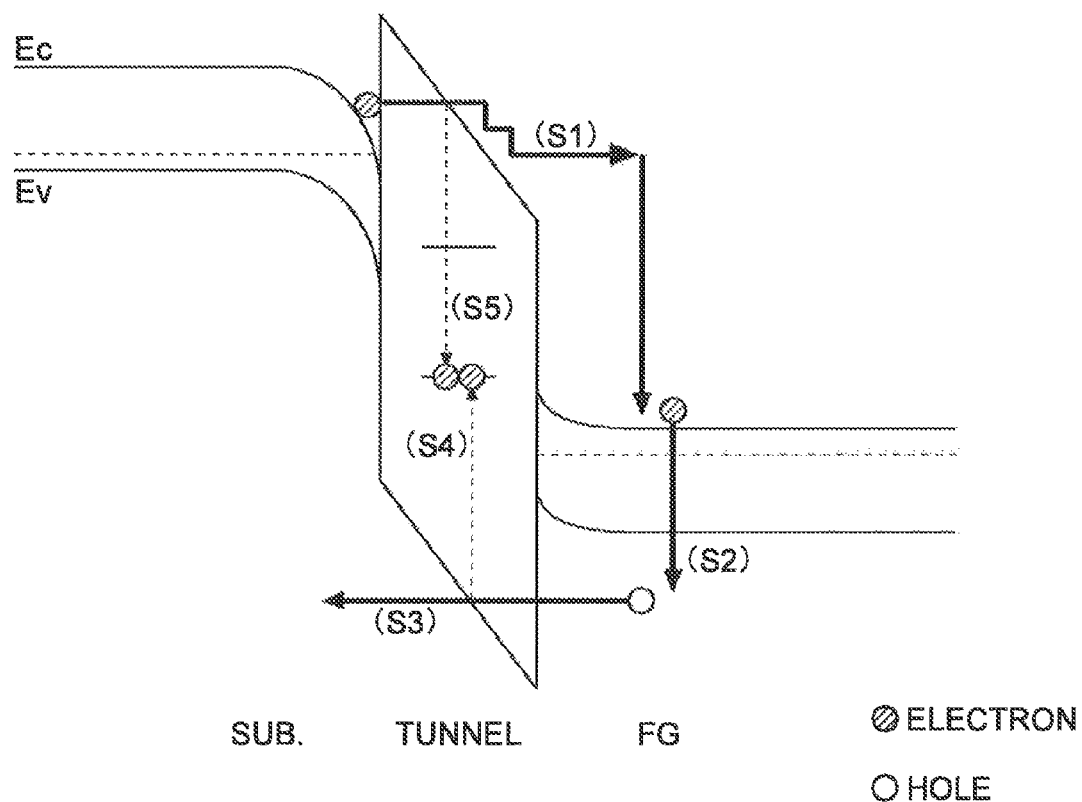
FIG. 4 is an illustration for explaining a mechanism to trap electrons in a tunnel layer of the NAND flash cell according to the embodiment.

FIG. 4 is an illustration for explaining a mechanism to trap electrons in the tunnel layer of the NAND flash cell according to the embodiment. In FIG. 4, the mechanism will be explained using a band structure of a substrate (SUB.), a tunnel layer (TUNNEL) and a floating gate (FG) of the NAND flash cell. Furthermore, in FIG. 4, a case where data is written by impressing a positive stress voltage Ec on a side of the floating gate FG will be explained as an example.

As shown in FIG. 4, firstly, a positive Fowler-Nordheim (EN) stress voltage is impressed on the side of the floating Gate (FG). Thereby, a band of the floating gate (FG) side becomes low, and electrons throws in the floating gate (FG) from a substrate side (SUB.) (step S1). As a result, writing on the floating gate (FG) is conducted. At that time, because the electrons throwing in the tunnel, layer (TUNNEL) by FN tunneling have high energy, holes are generated at the floating gate (FG) side by impact ionization (step S2). The generated holes, which may be called hot holes, drifts from the floating gate (FG) to the substrate (SUB.) by tunnel effect (step S3). At that time, some holes are trapped in the tunnel layer (TUNNEL), and thereby, electron traps occurred by hole trapping are generated in the tunnel layer (TUNNEL) (step S4). The electron traps captures electrons in write operation (step S5). As a result, the electrons are accumulated in the tunnel layer (TUNNEL).

The electron traps generated by hole trapping can be treated as electron defects. In such case, degradation of the NAND flash cell does not depend on the operation sequence, but is decided by a hole-injected amount (Qh value) into the tunnel layer (TUNNEL) by impact ionization. When electron defects in the tunnel layer (TUNNEL) are increased depending on the cycling count of write/erasure operations, because a certain amount of data is written in the NAND flash cell, writing in the NAND flash cells becomes easy while erasure from the NAND flash cell becomes difficult.

Figure 5:
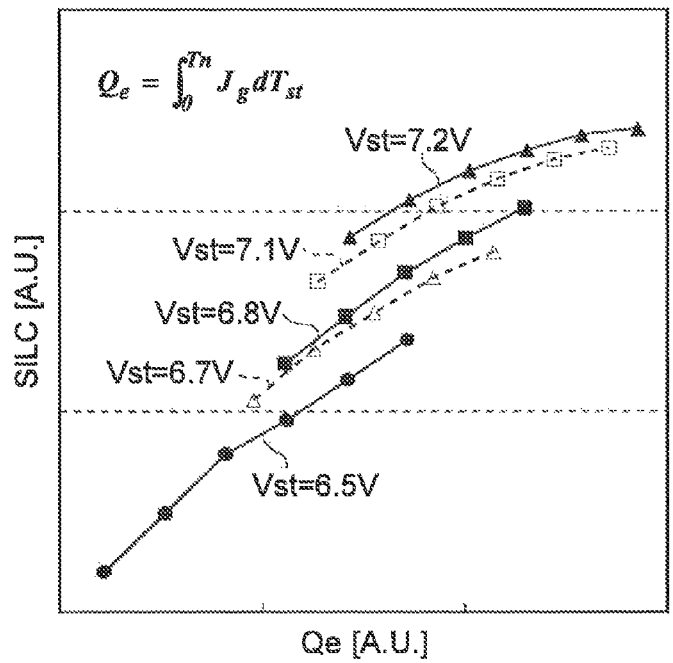
FIG. 5 is a correlation chart showing a relationship between an amount of electrons injected in the tunnel layer depending on a FN stress voltage impressed on a floating gate and an occurred SILC value according to the embodiment.

FIG. 5 is a correlation chart showing a relationship between an amount of electrons injected in the tunnel layer (hereinafter to be referred to as an electron-injected amount (Qe value) depending on a EN stress voltage impressed on the floating gate and an occurred SILC (stress-induced leakage current) value. The electron-injected amount (Qe value) shown in FIG. 5 is calculated by applying a stress time and a gate leak current density (Jg), which are obtained by using a transistor having a thick oxide layer (being equal to the tunnel layer) and impressing different gate stress voltages ranging from 6.5 V to 7.2 V on a gate side, to the following formula (1).

$$Q_e = \int_0^{Tn} J_g dT_{st} \qquad (1)$$

In the formula (1), Tn is a total time of impressing the gate stress voltage, and Tst is a stress time parameter for integration. The SILC value can be defined as a gain amount of the gate leak current between before and after the gate stress voltage is impressed while a constant bias (i.e., SILC=Jg_initial−Jg_stressed) is impressed.

As shown in FIG. 5, the greater the electron-injected amount (Qe value) is, the greater the SILC value associated with the different gate stress voltages becomes. However, because the SILC value also increases depending on the gate stress voltage, it is not possible to decide the SILC value only based on the electron-injected value (Qe value).

Figure 6:
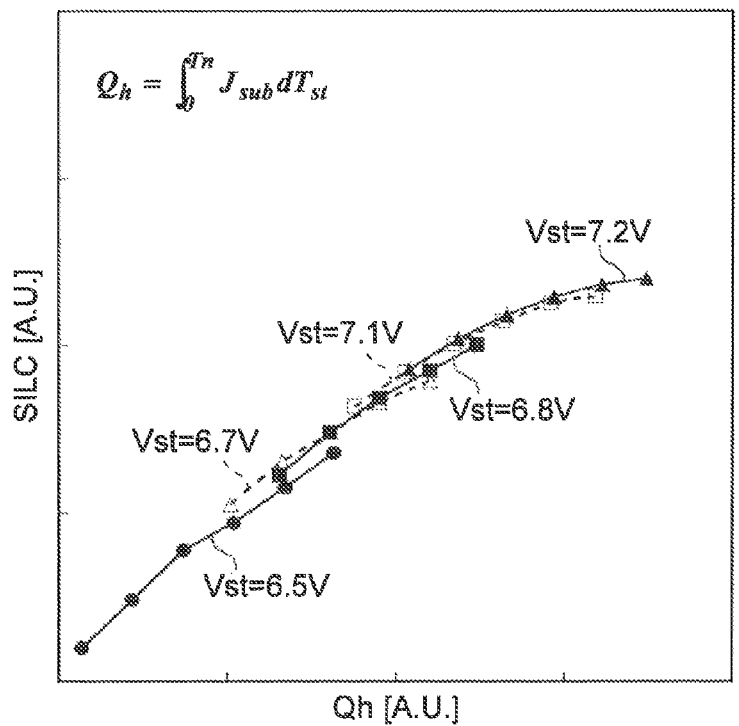
FIG. 6 is an universal correlation chart showing a relationship between an amount of holes injected in the tunnel layer depending on the FN stress voltage impressed on the floating gate and the occurred SILC value according to the embodiment.

FIG. 6 is an universal correlation chart showing a relationship between an amount of holes injected in the tunnel layer depending on the FN stress voltage impressed on the floating gate (hole-injected amount (Qh value)) and the occurred SILC value according to the embodiment. The hole-injected amount (Qh value) shown in FIG. 6 is calculated by applying a stress time and a current density flowing through the substrate (Jsub), which are obtained by using the transistor having the thick oxide layer (being equal to the tunnel layer) and impressing the different gate stress voltages ranging from 6.5 V to 7.2 V on the gate side, to the following formula (2).

$$Q_h = \int_0^{Tn} J_{sub} dT_{st} \qquad (2)$$

As shown in FIG. 6, the greater the hole-injected amount (Qh value) is, the greater the SILC value associated with the different gate stress voltages becomes, although a curve thereof does not mostly depend on the gate stress voltage, and the curve substantively overlaps a single universal line. From this, it can be found that by using the hole-injected amount (Qh value), it is possible to specify a degree of degradation of the tunnel layer (amount of electron defects generated in the tunnel layer, for instance) with more precision.

Figure 7:
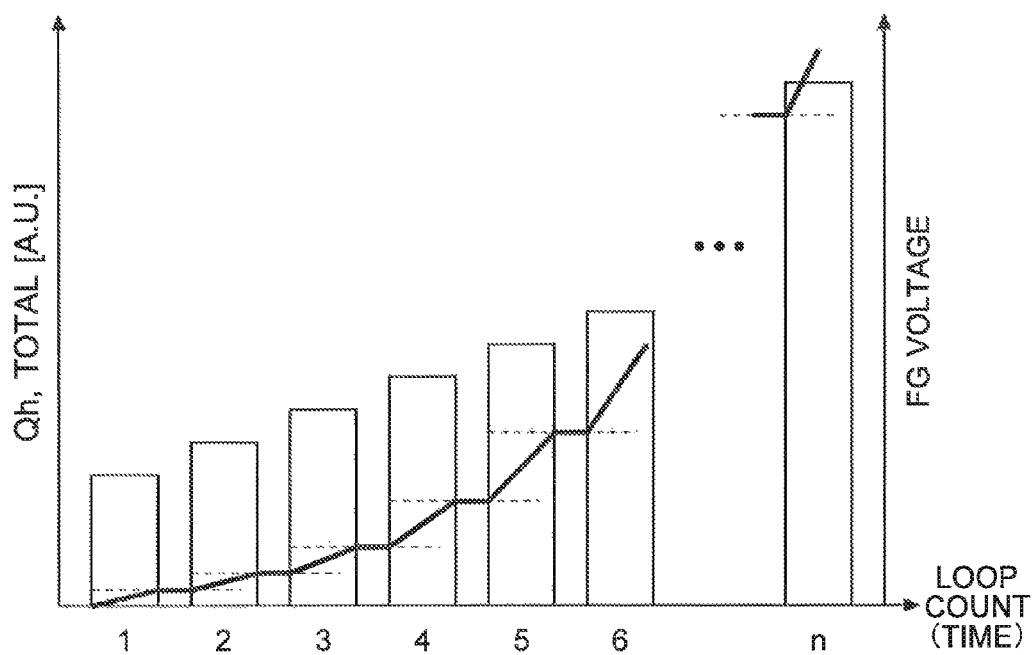
FIG. 7 is a schematic view for explaining an integrated value of amounts of hole-injection associated with an operation sequence of write/erasure with respect to the non-volatile memory including the NAND flash memories according to the embodiment.

FIG. 7 is a schematic view for explaining an integrated value of hole-injected amounts associated with an operation sequence of write/erasure with respect to a non-volatile memory including the NAND flash memories. In FIG. 7, a histogram shows stress voltage pulses, and a continuous line shows a total hole-injected amount (Qh,total).

In FIG. 7, a total hole-injected amount (Qh,total) occurred by impressing a stress voltage pulse for writing/erasing in/from the NAND flash memory can be calculated using the following formula (3).

$$Q_{h,total} = \sum_{1}^{n} \int_{0}^{Tn} J_{sub}(V_{prg,n}) dT_{st} + \sum_{1}^{n} \int_{0}^{Tn} J_{sub}(V_{erase,n}) dT_{st} \quad (3)$$

In the formula (3), ($V_{prg,n}$) a value of a n-th (n is a positive integer) stress voltage pulse in a write operation, and ($V_{erase,n}$) is a value of a n-th stress voltage pulse in an erasure operation. In the formula (3), a pulse time $T_{pulse}$ of each pulse is assumed as being constant, but when the pulse time is different by each pulse, the total hole-injected amount can be calculated using the following formula (4). In the formula (4), $Q_{h,\ total}$ is an integrated value of hole-injected amounts associated with the operation sequence of write/erasure with respect to the non-volatile memory, n is a positive integer, $J_{sub}$ is a substrate current density, $T_{st}$ is a stress time parameter for integration, $T_{prg,n}$ is a stress time of a n-th pulse in a write operation, $V_{prg,n}$ is a value of the stress voltage of the n-th pulse in the write operation, $T_{erase,n}$ is a stress time of a n-th pulse in an erasure operation, and $V_{erase,n}$ is a value of the stress voltage of the n-th pulse in the erasure operation.

$$Q_{h,total} = \sum_{1}^{n} \int_{0}^{Tprg,n} J_{sub}(V_{prg,n}) dT_{st} + \sum_{1}^{n} \int_{0}^{Terase,n} J_{sub}(V_{erase,n}) dT_{st} \quad (4)$$

Figure 8:
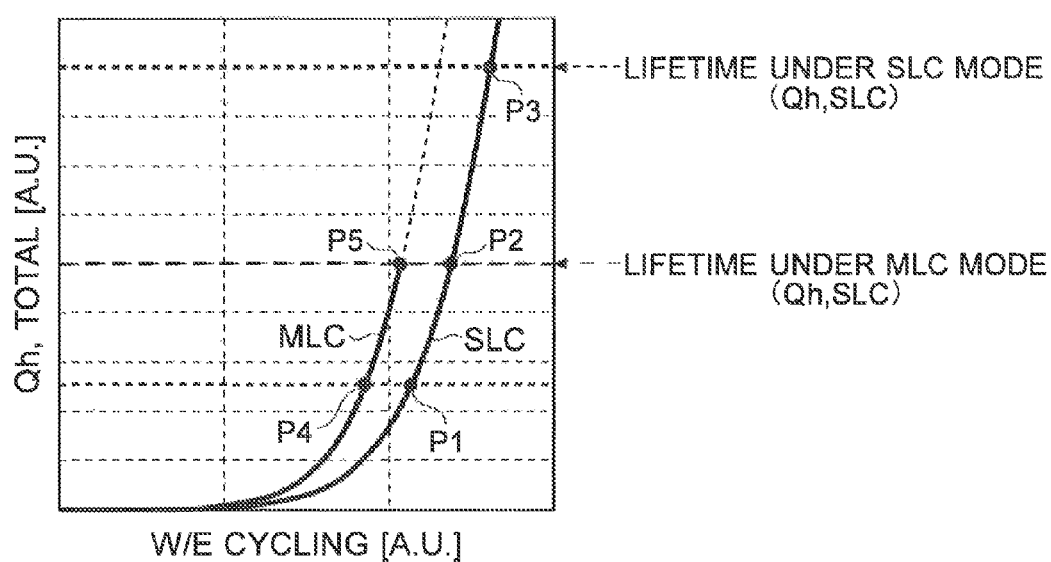
FIG. 8 is a correlation chart showing a relationship between a total amount of hole-injection and the number of cycling of write/erasure operations at a time when the non-volatile memory including the NAND flash memories is written/erased with different modes.

FIG. 8 is a correlation chart showing a relationship between a total hole-injected amount and a cycling count of write/erasure operations at a time when the non-volatile memory including the NAND flash memories is written/erased with different modes.

As shown in FIG. 8, with different modes, the total hole-injected amount (Qh, total) are different. For example, a total hole-injected amount (Qh,total) occurred at a time when write/erasure operation is executed with a multivalued mode (MLC mode) until a certain W/E cycling count is greater than a total hole-injected amount (Qh,total) occurred at a time when write/erasure operation is executed with a binary mode (SLC mode) until the certain W/E cycling count. However, depending on the design, there is a case where the total hole-injected amount (Qh,total) occurred at the time when write/erasure operation is executed with a binary mode (SLC mode) until the certain W/E cycling count becomes Greater than the total hole-injected amount (Qh,total) occurred at the time when write/erasure operation is executed with the multivalued mode (MLC mode) until the certain W/E cycling count.

A margin for results of writing/erasing is different with each operation mode. Therefore, a lifetime is also different with each operation mode. For example, in the MLC mode, because a threshold voltage distribution of each value is narrow compared with the SLC mode, the operation sequence of write/erasure becomes complicated. As a result, because a different is occurred between a hole-injected amount (Qh value) in the MLC mode and a hole-injected amount (Qh value) in the SLC mode, generally, a lifetime in the MLC mode becomes shorter than that in the SLC mode.

Therefore, a remaining lifetime (W/E cycling count) from the same hole-injected amount (Qh,total) in an operation with the SLC mode is longer than that in an operation with MLC mode. For example, a lifetime (Qh,MLC) in a case of conducting writing/erasing with the MLC mode alone may be 2000 (2 k) times, whereas a lifetime (Qh,MLC) in a case of conducting writing/erasing with the SLC mode alone may be 10000 (10 k) times (point P3).

FIG. 8, indicates that the lifetime in the multivalued mode (Qh,MLC) is less than the lifetime in the binary mode (Qh,SLC). When the non-volatile memory operates with a single mode from beginning to end, by adjusting parameters such as the starting voltage $V_{start}$, or the like, it is possible to maintain the lifetime (Qh,bd) in each mode. However, when the non-volatile memory operates with the combination operation mode of the multivalued mode and the binary mode, the total hole-injected amount (Qh,total) until a certain W/E cycling count is not always constant.

Figure 9:
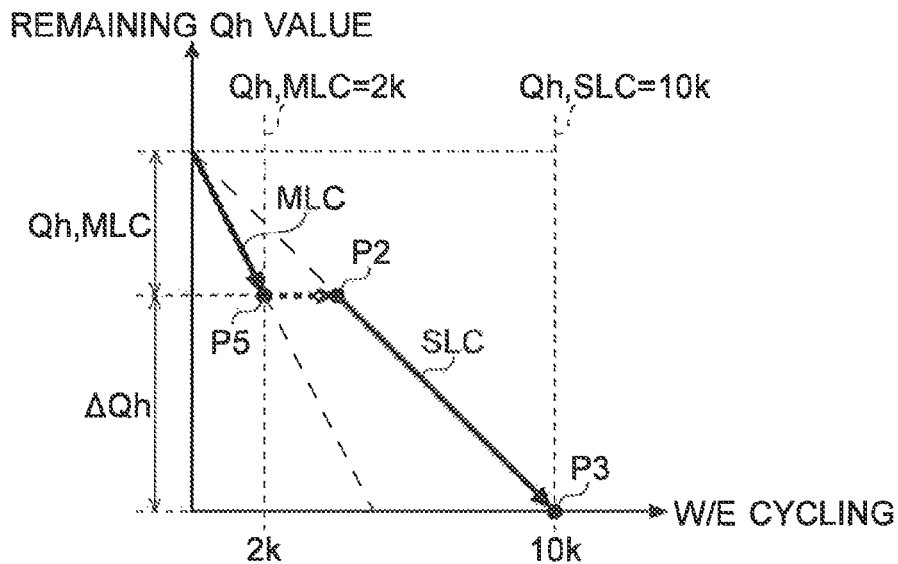
FIG. 9 is an illustration showing a relationship between the number of cycling and a remaining Qh value in an operation in which an operation mode of the non-volatile memory is changed from a MLC mode to a SLC mode.
Figure 10:
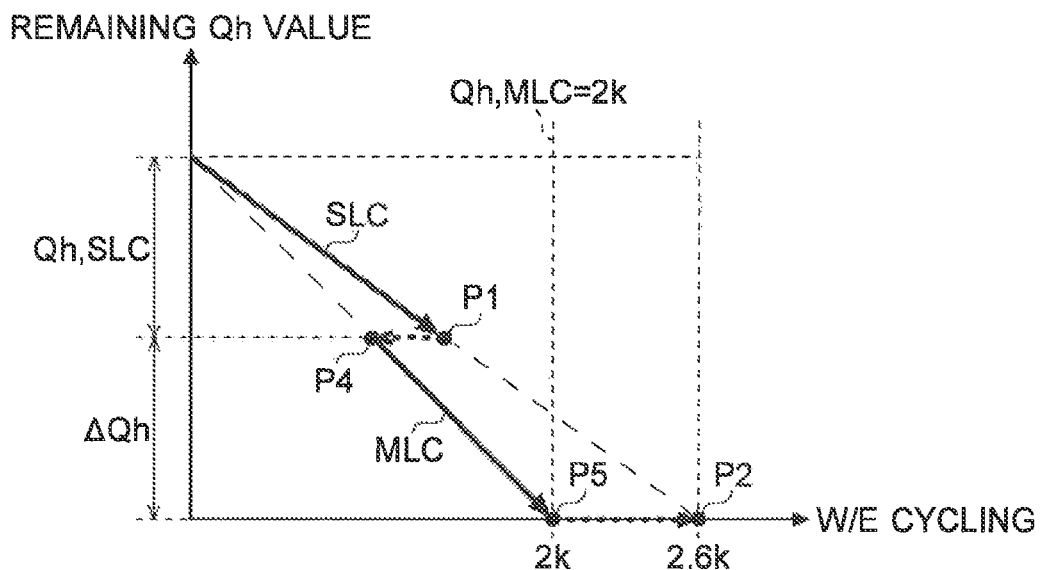
FIG. 10 is an illustration showing a relationship between the number of cycling and a remaining Qh value in an operation in which an operation mode of the non-volatile memory is changed from a SLC mode to a MLC mode.

FIGS. 9 and 10 show a relationship between a W/E cycling count and a hole-injected remaining amount (remaining Qh value) in a case where the non-volatile memory including the NAND flash memories operates with the combination operation mode. FIG. 9 shows a relationship in a case where an operation mode of the non-volatile memory is changed from the MLC mode to the SLC mode (operation mode A), and FIG. 10 shows a relationship in a case where an operation mode of the non-volatile memory is changed from the SLC mode to the MLC mode (operation mode B). Points P2, P3 and P4 in FIG. 9 correspond to points P2, P3 and P4 in FIG. 8. Likewise, points P1, P2, P4 and P5 in FIG. 10 corresponds to points P1, P2, P4 and P5 in FIG. 8.

The operation mode A is an effective operation mode, for instance, for a case where application installed on a device having the non-volatile memory prioritizes a memory capacity. As shown in FIGS. 8 and 9, in the operation mode A, firstly, write/erasure operations are executed with the multivalued mode, and then, when total hole-injected amount (Qh,total) reaches to the lifetime in the multivalued mode (Qh,MLC) (point P5), write/erasure operations are executed with the binary mode from a total hole-injected amount in the SLC mode (Qh,total) (point P2), which corresponds to the lifetime in the multivalued mode (Qh,MLC), to a lifetime in the binary mode (Qh,SLC) (point P3). In this way, because the lifetime in the binary mode (Qh,SLC) remains even if the lifetime in the multivalued mode (Qh,MLC) is ended, by switching the operation mode to the binary mode, it is possible to use the non-volatile memory as a physical memory. The hole-injected remaining amount in the binary mode after the lifetime in the multivalued mode (Qh,MLC) is ended can be predicted using the following formula (5), for instance.

$$\Delta Q_h = Q_{h,SLC} - Q_{h,MLC}(N_{WE}) \quad (5)$$

On the other hand, the operation mode B is an effective operation mode, for instance, for a case where application installed on a device having the non-volatile memory prioritizes a performance such as a, operation speed, or the like. As shown in FIGS. 10 and 8, in the operation mode B, firstly, write/erasure operations are executed with the binary mode, and then, as triggering a defection of the memory capacity, or the like, the operation mode is switched to the multivalued mode (from point P1 to point P4). After that, when the total hole-injected amount (Qh,total) reaches to the lifetime in the multivalued mode (Qh,MLC) (point P5), the operation mode is switched to the binary mode (point P2), and write/erasure operations with the binary mode are executed until the lifetime in the binary mode (Qh,SLC) is ended (point P3). The hole-injected remaining amount in the multivalued mode at a time of switching the operation mode from the binary mode to the multivalued mode can be predicted using the following formula (6), for instance.

$$\Delta Q_h = Q_{h,MLC} - Q_{h,SLC}(N_{WE}) \qquad (6)$$

Here, because the lifetime in the multivalued mode (Qh, MLC) is less than the lifetime in the binary mode (Qh,SLC), in order to switch the operation mode from the binary mode to the multivalued mode before the lifetime in the multivalued mode is ended, the hole-injected amount (Qh,SLC($N_{WE}$)) associated with write/erasure operation in the binary mode should be suppressed below the hole-injected amount in the multivalued mode (Qh,SLC).

In the embodiment, although the hole-injected remaining amount (remaining Qh value) is calculated by comparing the total hole-injected amount (Qh,total) and the lifetime in each operation mode, it is not limited to such calculation. For example, it is also possible to preset the lifetime in each operation mode as an upper limitation of the W/E cycling count, and predict the remaining lifetime (W/E cycling count) in each mode by comparing the preset upper limitation and a current W/E cycling count.

Figure 11:
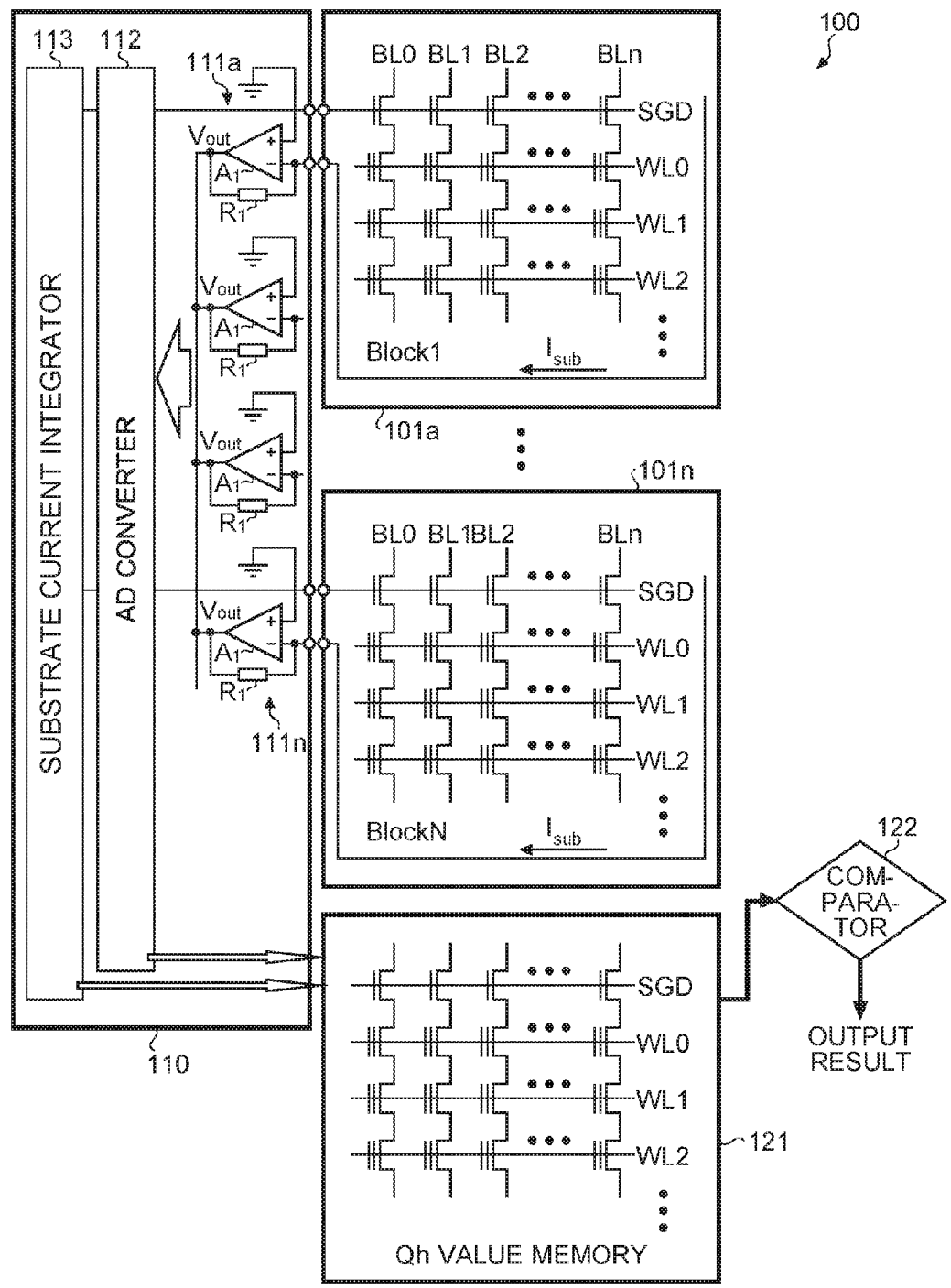
FIG. 11 is a schematic diagram showing an outline configuration of a memory system with a lifetime prediction system according to the embodiment.

FIG. 11 is a schematic diagram showing an outline configuration of a memory system with a lifetime prediction system according to the embodiment. As shown in FIG. 11, a memory system 100 has a plurality of physical blocks 101a to 101n, a controller 110, a Qh value storage 121 and a comparator 122. The controller 110, the Qh value storage 121 and the comparator 122 are constructing a lifetime prediction system. The plurality of physical blocks 101a to 101n are physically separated from one another.

Each physical block 101a to 101n has a configuration that a plurality of NAND flash cells are arrayed in two-dimensionally. The controller 110 has amplification units 111a corresponding to the physical blocks 101a to 101n, respectively, an AD converter 112 and a substrate current integrator 113. Each amplification unit 111a to 111n has an amplifier $A_1$ and a resistor $R_1$. A non-inverting input terminal (+) of the amplifier $A_1$ is grounded, and an inverting input, terminal (−) is electrically connected to a substrate of the physical blocks 101a to 101n. The resistor $R_1$ is connected between an output terminal of the amplifier $A_1$ and the inverting input terminal (−) in parallel.

A substrate current $I_{sub}$ of each physical block 101a to 101n is inputted to the AD converter 112 via the amplification units 111a to 111n. The AD converter 112 converts a current value (Qh value) of the amplified substrate current from an analog value to a digital value. The substrate current integrator 113 records the digitalized Qh value on the Qh value storage 121. The Qh value storage 121 is a memory having word lines of which number corresponds to that of the physical blocks 101a to 101n, and manages the total hole-injected amount (Qh,total) of each physical block 101a to 101n. Instead of the Qh value storage 121, the total hole-injected amount (Qh,total) of each physical block 101a to 101n can be recorded in a part (dummy block, for instance) of one of the physical blocks 101a to 101n.

To the comparator 122, the lifetime, in each operation mode (Qh,SLC), (Qh,MLC), or the like, is preset, for instance. In a case of determining an element condition (degradation condition) of each physical block 101a to 101n or predicting a remaining lifetime of each physical block 101a to 101n, the comparator 122 compares a total hole-injected amount (Qh,total) of each physical block 101a to 101n read out from the Qh value storage 121 and the lifetime in each operation mode (Qh,SLC), (Qh,MLC), or the like, and outputs the comparison result (result of element, condition determination, result of lifetime prediction) to a superior device (controller LSI, or the like) for determining the operation mode, for instance.

Figure 12:
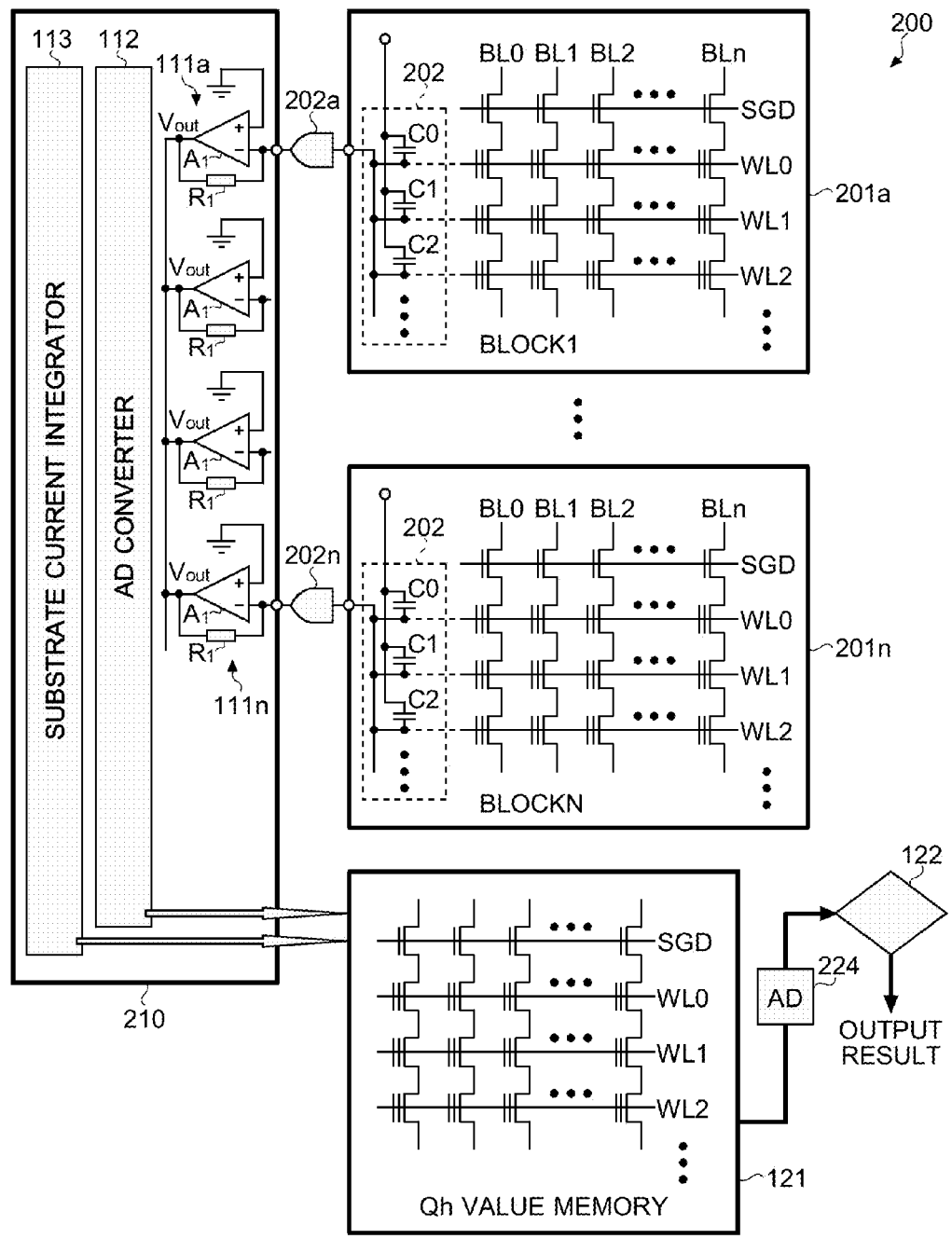
FIG. 12 is a schematic diagram showing an outline configuration of a memory system with another lifetime prediction system according to the embodiment.

FIG. 12 is a schematic diagram showing an outline configuration of a memory system with another lifetime prediction system according to the embodiment. In FIG. 12, as the same configuration as in FIG. 11, the same reference number will be applied and the redundant explanations will, be omitted.

The lifetime prediction system of memory system 200 shown in FIG. 12 predicts a remaining lifetime of each physical block 201a to 201n by integrating substrate currents of a monitor capacitor array 202 added to each physical block 201a to 201n in the non-volatile memory including the NAND flash memories.

As shown in FIG. 12, on each physical, block 201a to 201n, the monitor capacitor array 202 constructed from monitor capacitors C0, C1, C2, . . . , of which number corresponds to that of the word lines, connected in parallel is additionally installed. In write/erasure operation with respect to each physical block 201a to 201n, a stress voltage same as that to a floating gate (FG) is impressed to the monitor capacitor array 202 at the same time. Therefore, as the configuration shown in FIG. 11, a substrate current of the monitor capacitor array 202 is inputted to the AD converter 112 via the amplification units 111a to 111n, and a Qh value digitalized by the AD converter 112 is recorded on the Qh value storage 121 from the substrate current integrator 113. Furthermore, the comparator 122 compares the present lifetime in each operation mode and the total hole-injected amount (Qh,total) recorded on the Qh value storage 121, and the comparison result thereof is outputted to the superior device (controller LSI, or the like), for instance, as a result of element condition determination or lifetime prediction of each physical block 201a to 201n.

In FIG. 12, the monitor capacitors C0, C1, C2, . . . can be independently added to a NAND peripheral circuit aside from the physical blocks 201a to 201n, or can be connected to each word line WL of each physical block 201a to 201n as additional bits. That is, the monitor capacitors C0, C1, C2, . . . can be installed based on an optimization design considering a manufacturing process. In a case where the monitor capacitors C0, C1, C2, . . . are installed to each word line WL of each physical block 201a to 201n as additional bits, a bit line connecting the additional monitor capacitors C0, C1, C2, . . . , becomes a monitor bit line BLm. In an actual operation, the monitor bit line BLm is grounded, and the hole-injected amount (Qh value) is extracted from the monitor capacitors C0, C1, C2, . . . on the monitor bit line BLm while writing/erasing in/from cells on the real word lines.

As described above with reference to FIG. 6, the SILC value and the hole-injected amount (Qh value) universally correlate. Therefore, instead of using the substrate current, by using the SILC value, it is also possible to predict the degree of element degradation and the remaining lifetime. For example, in FIG. 12, by monitoring a SILC value instead of a substrate current flowing through a formation region of the monitor capacitors C0, C1, C2, . . . , and converting the monitored SILC value into a hole-injected amount (Qh value), it is also possible to predict the remaining lifetime. Because the SILC value can be measured using a readout voltage and a low voltage to the word lines WL (a readout voltage for reading out, for instance), it is possible to prevent the cells on the word lines WL from being influenced.

Figure 13:
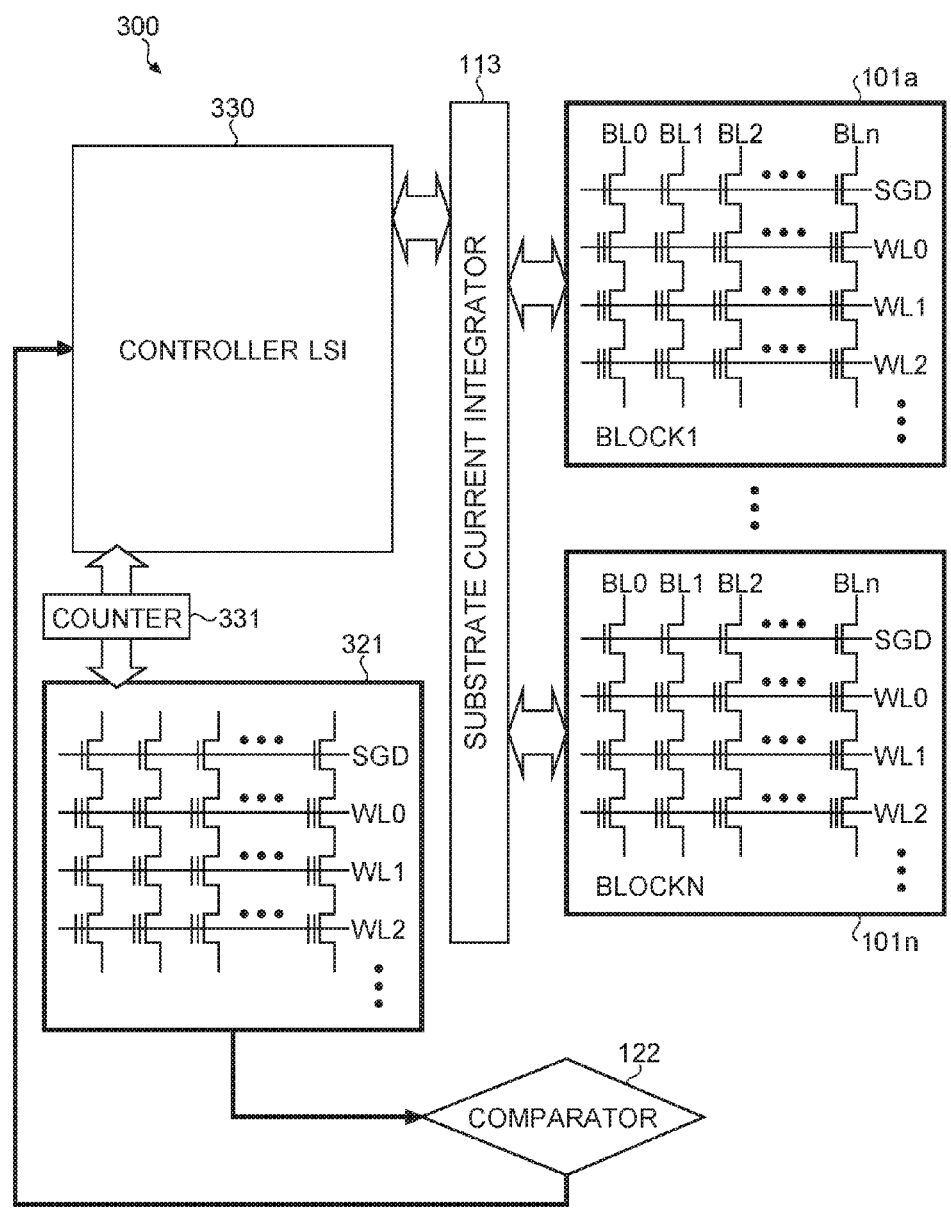
FIG. 13 is a schematic diagram showing an outline configuration of a memory system with yet another lifetime prediction system according to the embodiment.

FIG. 13 is a schematic diagram showing an outline configuration of a memory system with yet another lifetime prediction system according to the embodiment. A lifetime prediction system shown in FIG. 13 predicts a lifetime of each physical block while monitoring the cycling count of write/erasure operations with respect to the non-volatile memory including the NAND flash memories.

In a memory system 300 shown in FIG. 13, by using the correlation relationship between the Qh value in each operation mode shown in FIG. 8 and the W/E cycling count, a counter 331 counts a W/E cycling count $N_{WE}$ of write/erasure operations with respect to each physical block 101a to 101n, and a count value thereof is recorded on a counter memory 321. Furthermore, in the memory system 300, by converting the recorded W/E cycling count $N_{WE}$ into a Qh value and comparing the converted Qh value using the comparator 122, controller LSI 330 predicts a remaining lifetime in each operation mode or a remaining lifetime in the combination operation mode after the operation mode is switched from one to the other. As the counter 331 for counting the cycling count $N_{EW}$ of write/erasure operations, a D-type flip-flop (DFF) circuit can be used, for instance.

Figure 14:
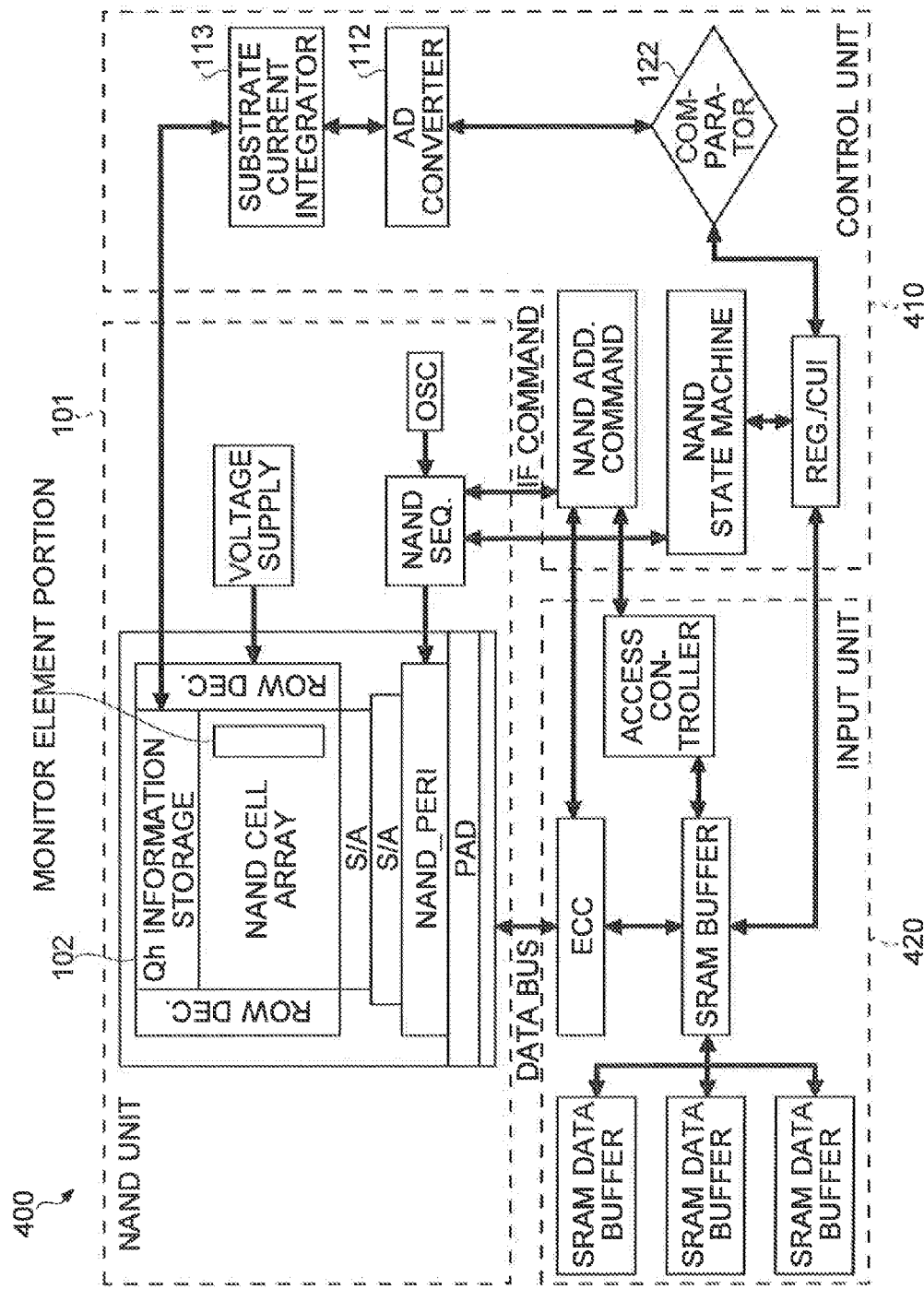
FIG. 14 is a schematic diagram showing an outline configuration of a SSD having the memory system according to the embodiment.

FIG. 14 is a schematic diagram showing an outline configuration of a SSD having the memory system shown in FIG. 11, for instance. In FIG. 14, the physical blocks 101a to 101n will be explained as a NAND unit 101 without distinguishing one from the other. Furthermore, in FIG. 14, instead of the Qh value storage 121, the total hole-injected amount (Qh,total) is recorded on a dedicated block (Qh information storage 102) in the NAND unit 101.

As shown in FIG. 14, the SSD 400 has a controller 410 and an input unit 420 in addition to the NAND unit 101. The controller 410 corresponds to the controller LSI 330 in FIG. 13, for instance, and is modified for the memory system 100 shown in FIG. 11.

In the SSD 400 shown in FIG. 14, the hole-injected amount (Qh value) is recorded on the Qh information storage 102 being the dedicated block. The substrate current integrator 113, the AD converter 112 and, the comparator 122 are integrated in the controller 410. Here, as the memory system 200 shown in FIG. 12, when the monitor capacitor array 202 is installed, the monitor capacitor array 202 may be integrated in the NAND unit 101.

When a remaining lifetime of the NAND unit 101 is predicted by monitoring SILC values of the monitor capacitors C0, C1, C2, . . . , the Qh value storage 121, the substrate current integrator 112 and the AD converter 112 shown in FIG. 11 or 12 can be omitted. In such case, a SILC value at a time when constant bias voltage is impressed to the monitor capacitors C0, C1, C2, . . . may be read out, and the read-out SILC value and the preset lifetime in each operation mode may be compared by the comparator 122.

In a case of monitoring the W/E cycling count, the W/E cycling count may be recorded on the dedicated block (corresponding to the Qh information storage 102) in the NAND unit 101 or may be registered on an address mapping table for converting a logical address and a NAND physical block.

Figure 15:
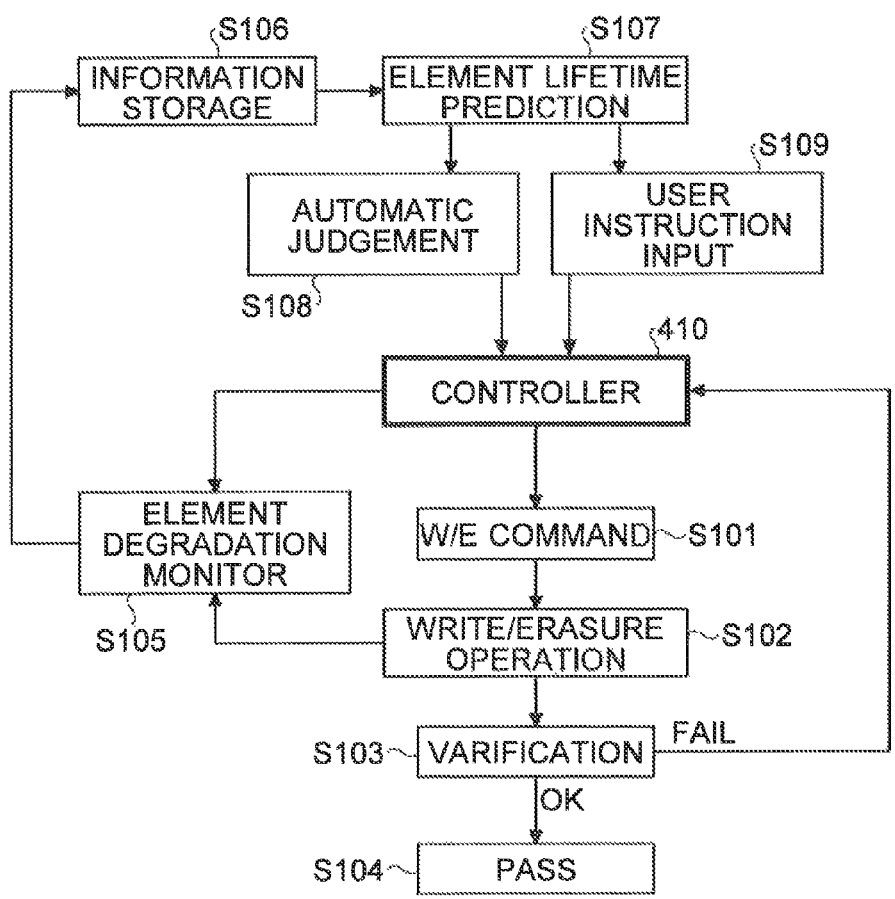
FIG. 15 is a conceptual diagram showing an operation flow of the lifetime prediction system for predicting a remaining lifetime by monitoring device degradation while executing write/erasure operation of the non-volatile memory according to the embodiment.

FIG. 15 is a conceptual diagram showing an operation flow of the lifetime prediction system for predicting a remaining lifetime by monitoring device degradation while executing write/erasure operation of the non-volatile memory. In FIG. 15, an operation of the controller 410 in FIG. 14 will be focused on.

In FIG. 15, in the controller 410, remaining lifetimes of the operation modes (for instance, (Qh,SLC) and (Qh,MLC)) are preset. When a W/E cycling operation (write/erasure operation) is actually executed, the controller 410 output a W/E command for writing/erasing (S101). Thereby, a write/erasure operation with respect to a target block is executed (S102). A result of the write/erasure operation is verified (S103), and when the result is included in an acceptable range for the write/erasure result (OK), the controller 410 executes a next operation (S104). On the other hand, as a result of S103, when the result is not included in the acceptable range (FAIL), the controller 410 returns to S101 and executes the following steps again.

At a time of write/erasure operation with respect to the target block, the controller 410 monitors a substrate current occurred in the target block at the time of the write/erasure operation while recording information about the operation sequence (for instance, pulse count, pulse time, pulse bias, or the like) (S105), calculates a total hole-injected amount (Qh,total) (or W/E cycling count) by integrating the monitored substrate currents, and records the calculated value (Qh,total) on the Qh information storage 102 (S106).

Next, the controller 410 predicts a remaining lifetime by comparing the total hole-injected amount (Qh,total) (or W/E cycling count) recorded on the Qh information storage 102 and the preset lifetimes (Qh,SLC) and (Qh,MLC) of the operation modes (S107). Then, the controller 410 adjusts the operation mode by automatically judging based on the preset remaining lifetime (S108) or by notifying the predicted remaining lifetime to a user and accepting an instruction with respect to the notification from the user (S109).

The monitoring of element degradation (s105) will be executed by reading out the recorded total hole-injected amount (Qh,total), the recorded W/E cycling count or the recorded SILC value, and timings of the monitoring can be designed as timings with regular interval after the read-out value becomes over a predetermined ratio (80%, for instance) of the preset lifetime of each operation mode. For example, when the preset lifetime of the MLC mode is assumed as 3000 cycles, after the recorded. W/E cycling count becomes over 2400 cycles being 80% of the preset lifetime, it is possible to judge a condition of element degradation and predict a remaining lifetime by monitoring the element, degradation for every 100 cycle.

In the combination operation mode of the SLC mode and the MLC mode, it is also possible to structure in that initial write/erasure operations are executed under the SLC mode, and after a remaining memory capacity becomes equal to or less than 20%, the operation mode is switched to the MLC mode. In such case, it is possible to calculate the remaining lifetime (write/erasure count) in the switched operation mode by judging a condition of element degradation at the time of switching the operation mode.

When a user instruction is not inputted after a remaining lifetime in the single operation mode or the combination operation mode is predicted, by executing the automatic judgment (S108), it is possible to manipulate data or adjust the operation mode in order to prevent the recorded data from being destroyed. For example, when a remaining memory capacity in the SLC mode becomes less than 10%, it is possible to automatically switch the operation mode to the MLC mode or automatically copy the recorded data to another memory system.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
an integration unit configured to detect substrate currents flowing through a substrate of a non-volatile memory when the non-volatile memory with a memory cell which has binary or more is written/erased, the integration unit recording first integration values of the substrate currents detected by the integration unit into a storage;
a prediction unit configured to predict a lifetime of the non-volatile memory based on the first integration values which are recorded on the storage;
a controller configured to switch an operation mode with respect to the non-volatile memory to either one of two modes, one being a first mode with binary writing and the other being a second mode with multivalued writing being greater than the binary writing,
wherein the prediction unit predicts, when the controller switches the operation mode from either one of the first mode and the second mode to the other mode, a remaining lifetime of the non-volatile memory in the switched other mode based on the first integration values recorded on the storage while predicting a remaining lifetime of the non-volatile memory for every write/erasure operation toward the non-volatile memory based on the first integration values recorded on the storage.

2. The system according to claim 1, wherein when assuming that $Q_{h,total}$ is a second integration value of hole-injected amounts associated with an operation sequence of write/erasure toward the non-volatile memory, n is a positive integer, $I_{sub}$ is a current density flowing through a substrate, $T_{st}$ is a stress time parameter for integration, $T_{prg,n}$ is a stress time of a n-th pulse in write operation, $V_{prg,n}$ is a stress voltage in the n-th pulse in the write operation, $T_{erase,n}$ is a stress time of a n-th pulse in erasure operation, and $V_{erase,n}$ is a stress voltage in the n-th pulse in the erasure operation, the prediction unit predicts a remaining lifetime of the non-volatile memory based on the second integration value and the following formula $$Q_{h,total} = \sum_{1}^{n} \int_{0}^{T_{prg,n}} J_{sub}(V_{prg,n}) dT_{st} + \sum_{1}^{n} \int_{0}^{T_{erase,n}} J_{sub}(V_{erase,n}) dT_{st}.$$

3. The system according to claim 1, wherein
the non-volatile memory includes a plurality of blocks being physically separated from one another,
the integration unit detects, for each block, the substrate currents flowing through the substrate where the block is formed, and records the first integration values of the detected substrate currents of each block on the storage while associating the values with each block, and
the prediction unit predicts the remaining lifetime for every block based on the first integration values of each block recorded on the storage.

4. The system according to claim 1, wherein
the non-volatile memory includes a plurality of memory cells and one or more monitor capacitors, and
the integration unit detects the substrate currents flowing through the one or more monitor capacitors, and records the first integration values of the substrate currents detected by the integration unit on the storage.

5. The system according to claim 4, wherein
the one or more monitor capacitors are formed on a substrate different from the substrate on which the plurality of memory cells are formed, and
a stress voltage being the same as a stress voltage to be impressed on a tunnel layer of the memory cell at a time of write/erasure operations toward the memory cell is impressed on the one or more memory capacitors.

6. The system according to claim 4, wherein
the one or more monitor capacitors are connected to word lines to which the memory cells are connected, and
a stress voltage being the same as a stress voltage to be impressed on a tunnel layer of the memory cell at a time of write/erasure operations toward the memory cell is impressed on the one or more memory capacitors.

7. The system according to claim 1, wherein
the storage is either a memory separated from the non-volatile memory or a partial region of the non-volatile memory, and
the prediction unit predicts the remaining lifetime by comparing the first integration values recorded on the storage and a preset lifetime of the non-volatile memory.

8. The system according to claim 1, wherein the controller switches, when the first integration values of the substrate currents obtained as results of write/erasure operations in either one of the first mode and the second mode reaches a preset threshold, the operation mode from either one of the first mode and the second mode to the other mode.

* * * * *